US008728848B2

(12) United States Patent
Girotto (10) Patent No.: US 8,728,848 B2
(45) Date of Patent: May 20, 2014

(54) SOLUTION PROCESSING METHOD FOR FORMING ELECTRICAL CONTACTS OF ORGANIC DEVICES (75) Inventor: Claudio Girotto, Brussels (BE)

(73) Assignees: IMEC, Leuven (BE); Katholieke Universiteit Leuven R&D, Leuven (BE)

( * ) Notice: Subject to any disclaimer, the term of this patent is extended or adjusted under 35 U.S.C. 154(b) by 313 days.

(21) Appl. No.: 13/106,665

(22) Filed: May 12, 2011

(65) Prior Publication Data

US 2011/0308598 A1 Dec. 22, 2011

Related U.S. Application Data (63) Continuation of application No. PCT/EP2009/062791, filed on Oct. 1, 2009.

(60) Provisional application No. 61/115,432, filed on Nov. 17, 2008.

(51) Int. Cl.
*H01L 31/18* (2006.01)
*H01L 51/00* (2006.01)

(52) U.S. Cl.
USPC ........... 438/63; 438/98; 438/99; 257/E31.124

(58) Field of Classification Search
USPC .................. 438/57, 63, 98, 99, 653; 136/256; 257/E31.033, E31.124
See application file for complete search history.

(56) References Cited

U.S. PATENT DOCUMENTS

| 7,888,593 B2* | 2/2011 | Marks et al. ................... 136/263 |
| 2006/0124922 A1 | 6/2006 | Kim et al. |
| 2008/0223445 A1* | 9/2008 | Marks et al. ................... 136/263 |
| 2009/0151787 A1* | 6/2009 | Yoshikawa et al. ........... 136/261 |
| 2010/0252113 A1* | 10/2010 | Marks et al. ................... 136/263 |
| 2011/0041895 A1* | 2/2011 | Carroll ............................ 136/250 |
| 2011/0209759 A1* | 9/2011 | Lee et al. ........................ 136/259 |

FOREIGN PATENT DOCUMENTS

WO     WO 02/080627     10/2002

OTHER PUBLICATIONS

Eom, et al., "Preparation and characterization of nano-scale ZnO as a buffer layer for inkjet printing of silver cathode in polymer solar cells", Solar Energy Materials & Solar Cells 92 (2008) pp. 564-570.
Gamerith, et al., "Direct Ink-Jet Printing of Ag—Cu Nanoparticle and Ag-Precursor Based Electrodes for OFET Applications", Adv. Funct. Mater. 2007, 17, pp. 3111-3118.
Girotto, et al., "Nanoparticle-based, spray-coated silver top contacts for efficient polymer solar cells", Organic Electronics 10 (2009) pp. 735-740.
Huang, et al., "Plastic-Compatible Low Resistance Printable Gold Nanoparticle Conductors for Flexible Electronics", Journal of the Electrochemical Society, 150, (7) (2003) pp. G412-G417.

(Continued)

Primary Examiner — Savitr Mulpuri
(74) Attorney, Agent, or Firm — Knobbe, Martens, Olson & Bear LLP

(57) ABSTRACT

A method for forming, on an organic semiconductor layer, an electrical contact layer comprising a metal, is disclosed. In one aspect, the method includes providing a charge collecting barrier layer on the organic semiconductor layer, providing a liquid composition comprising a precursor for the metal on the charge collecting barrier layer, and performing a sintering process. The charge collecting barrier layer is substantially impermeable to the components of the liquid composition.

16 Claims, 4 Drawing Sheets (a)

(b)

(56) References Cited

OTHER PUBLICATIONS

Kim, et al., "Efficient Tandem Polymer Solar Cells Fabricated by All-Solution Processing", Science 317, (2007) pp. 222-225.
Peet, et al., "Efficiency enhancement in low-bandgap polymer solar cells by processing with alkane dithiols", Nature materials, vol. 6, Jul. 2007, pp. 497-500.
Sekitani, et al., "Organic transistors manufactured using inkjet technology with subfemtoliter accuracy", PNAS, Apr. 1, 2008, vol. 105, No. 13, pp. 4976-4981.
International Search Report from related Application No. PCT/EP2009/062791 dated Nov. 23, 2009.

* cited by examiner

SOLUTION PROCESSING METHOD FOR FORMING ELECTRICAL CONTACTS OF ORGANIC DEVICES

CROSS REFERENCE TO RELATED APPLICATIONS

This application is a continuation of PCT Application No. PCT/EP2009/062791, filed Oct. 1, 2009, which claims priority under 35 U.S.C. §119(e) to U.S. provisional patent application No. 61/115,432 filed on Nov. 17, 2008. Each of the above applications is incorporated herein by reference in its entirety.

BACKGROUND OF THE INVENTION

1. Field of the Invention

This invention relates to a solution processing method for forming electrical contacts to organic devices, wherein the electrical contacts formed are suitable for being used in a process for manufacturing organic photovoltaic cells, e.g. fully solution processed organic photovoltaic cells.

2. Description of the Related Technology

Organic photovoltaic cells have reached power conversion efficiencies above 5%, as reported e.g. by J. Peet et al. in "Efficiency enhancement in low-bandgap polymer solar cells by processing with alkane dithiols", Nature Mater. 6.7 (2007), 497-500 and by J. Y. Kim et al. in "Efficient Tandem Polymer Solar Cells Fabricated by All-Solution Processing", Science 317.5835 (2007), 222. In order to achieve cheap, large area devices, there is a need for manufacturing methods that are compatible with in-line processing, such as for example methods based on solution processing.

Research efforts related to solution processing of photovoltaic cells have mainly focused on the deposition of the organic active layer, for example based on a P3HT:PCBM solution. Deposition methods that can be used for the fabrication of the active layer of organic photovoltaic cells are for example inkjet printing, flexography, gravure printing, spray coating, doctor blading and slot-die coating.

However, for processing of cheap large area devices it is preferred to provide all the layers of the device by means of methods that are compatible with in-line processing, such as for example methods based on solution processing. The deposition of a cathode typically involves vacuum deposition of a metal or the application of solution processed conductive polymer materials, such as for example doped conjugated polymers, e.g. polyanilines, polypyrroles or PEDOT. These conductive polymer materials are characterized by a low electrical conductivity, e.g. in the order of 0.1 to 10 S cm$^{-1}$ and poor electrical and/or thermal stability.

In addition, for processing of cheap large area devices it is preferred to use deposition methods that allow local deposition, i.e. deposition methods that allow providing patterned layers. Some solution-based methods that allow local deposition and which have been investigated for forming active layers or electrical contacts include ink-jet printing, micro-contact printing and spray coating.

A particular aspect related to all-solution processing is the need for compatibility of a solution processed layer with the underlying layer or film, i.e. there is a need for avoiding dissolution of underlying layers or films by a solvent of the solution processed layer. Techniques that may be used to solve this issue include the use of orthogonal solvents, cross linkable materials or fast evaporation of solvents.

In e.g. "Plastic-Compatible Low Resistance Printable Gold Nanoparticle Conductors for Flexible Electronics", Journal of The Electrochemical Society, 150.7 (2003) G412, it has been shown that inks comprising metal nanoparticles can be used for forming solution-based, highly conductive metal patterns. A good electrical conductivity, in the order of $10^4$-$10^6$ S cm$^{-1}$, can be obtained by sintering the ink at relatively low temperatures (for example at temperatures below 150° C.), or by other methods such as laser sintering. These processes can for example be used in the production of printed thin-film transistors, e.g. for forming source and drain electrodes.

Most of the research related to metal nanoparticle inks focuses on the production of bottom-contact devices, where for example ink-jet printing is used to pattern metal lines on a substrate, such as e.g. glass, silicon or plastic foils. As these metal patterns are formed on the substrate, before e.g. an active layer is provided, the process conditions (e.g. sintering process conditions, choice of solvent) are only limited by the properties of the substrate.

In "Organic transistors manufactured using inkjet technology with subfemtoliter accuracy", Proceedings of the National Academy of Sciences of the United States of America, Vol. 105, No. 13, Apr. 1, 2008, pp 4976-4980, Sekitani et al. report the fabrication of Ag source and drain contacts directly on the surface of an organic semiconductor film by solution processing using a subfemtoliter inkjet printer. The observation that good source and drain contacts can be inkjet printed on top of the organic semiconductor surface is attributed to the small volume of the droplets ejected from the subfemtoliter inkjet head. Because of the small volume (diameter less than 1 micrometer) of the droplets, the organic solvent of the metal ink substantially evaporates before the droplet reaches the semiconductor surface, such that the organic semiconductor films are not damaged by the solvents and there is no significant spreading of the nanoparticle droplets on the surface. Furthermore, the small size and large surface area of the droplets on the surface reduces the temperature required to remove the dispersing agent and fuse the nanoparticles into a metallic line with good electrical conductivity. It is reported that a temperature of 130° C. is sufficient to obtain a resistivity of 25 micro-Ohm cm. However, the technique reported by Sekitani et al. is not easily scalable to the processing of organic photovoltaic cells, where there is a need for a fast deposition technique able to cover large area contacts, e.g. contacts with an area of several square centimeters or larger.

In "preparation and characterization of nano-scale ZnO as a buffer layer for inkjet printing of silver cathode in polymer solar cells", Solar Energy Materials and Solar Cells 92 (2008), pp 564-570, S. H. Eom et al. report organic photovoltaic cells with a silver cathode formed by inkjet printing, wherein the cathode is formed after providing the organic semiconductor layer. Because of the hydrophilic character of both the silver ink and the surface of the organic semiconductor layer on which the silver cathode is to be formed, a hydrophilic ZnO layer is used as a buffer layer between the organic semiconductor layer and the silver cathode. However, the performance of the organic photovoltaic cells thus obtained is rather limited. It is shown that the cell efficiency increases with increasing annealing temperature of the ZnO layer. For annealing at 150° C., cell efficiencies of 0.2% are reported. This temperature of 150° C. can be considered as an upper temperature limit when using PEN (PolyEthylene Naphthalate) as a substrate. In case of a PET (PolyEthylene Terephthalate) substrate, the upper temperature limit is about 110° C.

SUMMARY OF CERTAIN INVENTIVE ASPECTS

In one aspect, there is a method based on solution processing for forming electrical contacts with a good (or improved)

electrical conductivity and a good (or improved) stability on an organic semiconductor layer, wherein the method allows fast large area processing (e.g. up to about several square meters per minute) of metal contacts at temperatures that are compatible with the underlying layers, i.e. at temperatures that are sufficiently low to avoid damage to the underlying layers (such as e.g. substrate, organic semiconductor layer, . . . ), e.g. particularly at temperatures below about 150° C. The method can for example be used for forming metal contacts of organic photovoltaic cells with good conversion efficiency.

A method for forming an electrical contact layer comprising a metal on an organic semiconductor layer, the method comprising: providing a charge collecting barrier layer on the organic semiconductor layer; providing a liquid comprising a precursor for the metal on the charge collecting barrier layer; and performing a sintering process, wherein the charge collecting barrier layer is substantially impermeable to components of the liquid.

The method according to the above wherein the electrical contact layer is a hole extracting contact layer.

The method according to the above wherein the charge collecting barrier layer is a hole collecting layer.

The method according to the above wherein the charge collecting barrier layer comprises an electrically conductive polymer.

The method according to the above wherein the charge collecting barrier layer comprises PEDOT:PSS.

The method according to the above wherein providing the charge collecting barrier layer comprises providing the charge collecting barrier layer by a solution processing method.

The method according to the above wherein providing a liquid comprises providing an ink comprising metal nanoparticles.

The method according to the above wherein providing a liquid comprises providing the liquid by means of spray coating.

The method according to the above wherein the method is performed at temperatures below about 150° C.

The method according to the above wherein the electrical contact layer has an electrical conductivity higher than about $10^4$ Scm-1.

Use of a method according to the above for forming an electrical contact of an organic photovoltaic cell.

Use of a method according to the above for forming a hole extracting contact of a fully solution processed organic photovoltaic cell with an inverted cell structure.

According to one inventive aspect, it is provided herein a method for forming, on an organic semiconductor layer, an electrical contact layer comprising a metal, the method comprising (or consisting of): (a) providing a charge collecting barrier layer on the organic semiconductor layer; (b) providing a liquid (composition) comprising a precursor for the metal on the charge collecting barrier layer; and (c) performing a sintering process; wherein the charge collecting barrier layer is substantially impermeable to the components of the liquid (composition). The charge collecting barrier layer being substantially impermeable to components of the liquid (composition) means that the charge collecting barrier layer is a continuous (closed) layer that substantially prevents penetration of components (such as e.g. solvent, particles, . . . ) of the liquid (composition) through the barrier layer to the underlying organic semiconductor layer. In this way damage to the underlying organic semiconductor layer can be avoided.

The organic semiconductor layer (i.e. active layer) may comprise semiconducting polymers, semiconducting small-molecules, fullerene derivatives, or any combinations thereof. Particularly, the organic semiconductor layer for use may comprise P3HT:PCBM.

The electrical contact layer may be a patterned layer.

The electrical contact layer may be a hole extracting layer and the charge collecting barrier layer may be a hole collecting layer.

The charge collecting barrier layer may be a hole collecting layer. Particularly, the hole collecting barrier layer for use herein may comprise a (electrically) conductive polymer such as PEDOT, polyaniline, polypyrroles, carbon black, or any combinations thereof.

The charge collecting barrier layer may comprise an electrically conductive polymer such as PEDOT:PSS.

The process of providing the charge collecting barrier layer may be performed by a solution processing method.

The liquid (composition) may comprise an ink comprising metal nanoparticles. Providing a liquid (composition) may comprise providing an ink comprising metal nanoparticles such as silver nanoparticles, gold nanoparticles, copper nanoparticles, any other metal that can be reduced into nanoparticles, or any combinations thereof. Particularly, the metal nanoparticles may comprise silver nanoparticles.

According to one inventive aspect, the metal nanoparticles for use herein have a size comprised in the range between about 2 nm and about 10 nm, particularly between about 2 nm and about 7 nm, more particularly between about 2 nm and about 5 nm.

The liquid (composition) may comprise metal complexes, metal salts or any combinations thereof. Providing a liquid (composition) may comprise providing a liquid (composition) comprising metal complexes or metal salts such as a silver salt.

The process of providing a liquid (composition) on the charge collecting barrier layer may be performed by spray coating. Providing a liquid (composition) may for example comprise providing the liquid (composition) by spray coating.

The process of providing a liquid (composition) on the charge collecting barrier layer may be performed by means of ink jet printing. Providing a liquid (composition) may for example comprise providing the liquid (composition) by ink jet printing.

The method may be performed at low temperatures, e.g. at temperatures below about 150° C.

The sintering and/or annealing process may be performed at temperatures below about 150° C.

The electrical contact layer may have an electrical conductivity that is higher than about $10^4$ S cm$^{-1}$, particularly higher than about $10^5$ S cm$^{-1}$, more particularly the electrical conductivity is comprised between about $10^5$ S cm$^{-1}$ and about $10^6$ S cm$^{-1}$.

According to another aspect, there is a method for manufacturing an organic device selected from the group consisting of organic photovoltaic cells, organic thin film transistors, organic light emitting devices, organic diodes and organic photodiodes, the method comprising forming an electrical contact of the organic device according to the method as described above.

The organic device may be selected from organic photovoltaic cells.

In another inventive aspect, it is provided herein a method for manufacturing a fully solution processed organic photovoltaic cell (with an inverted cell structure), the method comprising forming a hole extracting contact of the photovoltaic cell according to the method as described above.

In a method for manufacturing a fully solution processed organic photovoltaic cell (with an inverted cell structure), the photovoltaic cell (with an inverted cell structure) may provide a power conversion efficiency that exceeds about 3%, particularly about 4%, more particularly about 5%, even more particularly about 6%.

In still another aspect, there is a fully solution processed organic photovoltaic cell (with an inverted cell structure) comprising a hole extracting contact, wherein the hole extracting contact has been obtained according to the method as described above.

The method may for example be used for forming an electrical contact layer, for example a hole extracting electrical contact, of an organic photovoltaic cell.

The method may be used as part of a method for manufacturing a fully solution processed organic photovoltaic cell.

The method may for example also be used for forming an electrical contact layer of organic devices such as organic thin film transistors, organic light emitting devices, organic diodes or organic photodiodes.

Certain inventive aspects, both as to organization and method of operation, together with features and advantages thereof, may best be understood by reference to the following detailed description when read with the accompanying drawings.

BRIEF DESCRIPTION OF THE DRAWINGS

(FIG. 3(a)), 140° C. (FIG. 3(b)) and 180° C. (FIG. 3(c)) for 10 minutes.

DETAILED DESCRIPTION OF CERTAIN ILLUSTRATIVE EMBODIMENTS

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description are used for descriptive purposes and not necessarily for describing relative positions. It is to be understood that the terms so used are interchangeable under appropriate circumstances and that the embodiments of the invention described herein are capable of operation in other orientations than described or illustrated herein.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects.

Furthermore, while some embodiments described herein include some but not other features included in other embodiments, combinations of features of different embodiments are meant to be within the scope of the invention, and form different embodiments, as would be understood by those in the art.

In the description provided herein, numerous specific details are set forth. However, it is understood that embodiments of the invention may be practiced without these specific details. In other instances, well-known methods, structures and techniques have not been shown in detail in order not to obscure an understanding of this description.

According to one aspect, one embodiment relates to a method based on solution processing for forming electrical contacts with a good (or improved) electrical conductivity, e.g. an electrical conductivity in the range between about 10$^4$ and about 10$^6$ S cm$^{-1}$, and a good (or improved) stability on an organic semiconductor layer, wherein the method allows fast large area processing (e.g. up to several square meters per minute) of metal contacts at temperatures that are compatible with the underlying layers, e.g., at temperatures below about 150° C. The method may allow forming patterned layers and can for example be used for forming metal contacts of organic photovoltaic cells with good conversion efficiency.

The method according to one embodiment is further illustrated for the formation of metal contacts of organic photovoltaic cells. However, the invention is not limited thereto and can be used for forming patterned electrically conductive layers for other devices, such as for example organic thin film transistors, organic light emitting devices, organic diodes and organic photodiodes.

In the further description, the method according to one embodiment is illustrated for devices made on a glass substrate. However, other suitable substrates known by a person skilled in the art may be used, such as for example substrates comprising silicon, organic substrates such as for example PET or PEN foils, plastic sheets, steel substrates, metal foils such as e.g. Al foils, or any combinations thereof.

In one embodiment, the method comprises forming a solution processed metal contact on a layer comprising an organic material, e.g., an organic semiconductor. In the particular examples described below a liquid (composition) or an ink comprising silver nanoparticles is used as a precursor for forming the metal contact and the liquid (composition) or ink is applied by means of spray coating. However, other precursors for electrically conductive layers can be used such as for example precursors comprising metallic complexes or metal salts (such as e.g. a silver salt), and/or the precursor may comprise other nanoparticles, such as for example gold or copper nanoparticles or any other metal that can be reduced into nanoparticles. Other solution-based processing methods may be used, such as for example inkjet printing or any other suitable method known by a person skilled in the art.

It is known that a liquid (composition) or an ink comprising metal precursors can be used for forming metal layers with good electrical conductivity. In a particular aspect, the liquid (composition) or ink for use in a method according to one embodiment, may comprise metal nanoparticles, for example metal nanoparticles having a size, e.g., in the range between about 2 nm and about 10 nm, more particularly between about 2 nm and about 7 nm, even more particularly between about 2 nm and about 5 nm.

A liquid composition or ink for use herein may comprise, in addition to such metal nanoparticles, solvents such as for example toluene, IsoPropylAlcohol (IPA), acetone or cyclohexane. A solution may furthermore contain stabilizers for metal nanoparticles, for example polymers such as hexylamine or oleylamine, or self-assembled monolayers (SAM) surrounding the nanoparticles, such as for example thiols.

After application of such a liquid (composition) on a surface of a substrate, evaporation of the solvent or solvents of this liquid (composition) may result in a solid layer on the surface. Evaporation of the solvent or solvents can occur either during the application process of the ink itself, or in a subsequent process. For example, evaporation of the solvent or solvents can be activated by heating the substrate, e.g. by placing the substrate in a furnace or on a hot plate.

A solid layer comprising metal nanoparticles deposited from solution may have a large electrical resistivity immediately after deposition of the layer and evaporation of the solvent or solvents. However, it is known that such a layer comprising nanoparticles can be sintered, i.e. exposed to energy such that the nanoparticles fuse to a continuous layer, such as for example an electrically conductive layer with a good electrical conductivity, e.g. a conductivity higher than about $10^4$ S cm$^{-1}$. Sintering can for example be done by thermal annealing, or by microwave or UV light treatment.

Spray coating is a well established technique in graphic arts, industrial coating, and painting. In spray coating systems, an ink is atomized at a nozzle by pressure or ultrasounds and then directed towards a substrate by a gas flow. A random distribution of tiny droplets is formed on a surface of the substrate, thereby forming either a continuous wet layer (in case of large gas flow rates), or a layer characterized by sparse arrangements of dots that dry independently (in case of low gas flow rates). An advantage of this technique is the ability to cover relatively large areas by the superposition of small, e.g. femtoliter sized, droplets, the small droplets being characterized by a fast drying time in the order of a few microseconds. As a consequence of the fast drying time, the impact of the solvent used on an underlying layer may be limited as compared to other solution based deposition techniques. This spray coating method can be upscaled to a high-throughput in-line deposition method by choosing a nozzle with an appropriate wide spray pattern and eventually by providing a parallel arrangement of nozzles or an array of nozzles.

Experiments were done wherein an ink comprising Ag nanoparticles was applied on glass substrates by spray coating, and wherein the ink was annealed or sintered to form an electrically conductive layer. An appropriate sintering temperature and sintering duration for obtaining metal layers with good (or improved) electrical conductivity, e.g. particularly above about $10^4$ S cm$^{-1}$, more particularly above about $10^5$ S cm$^{-1}$, even more particularly between about $10^5$ S cm$^{-1}$ and about $10^6$ S cm$^{-1}$ was determined.

Figure 1:
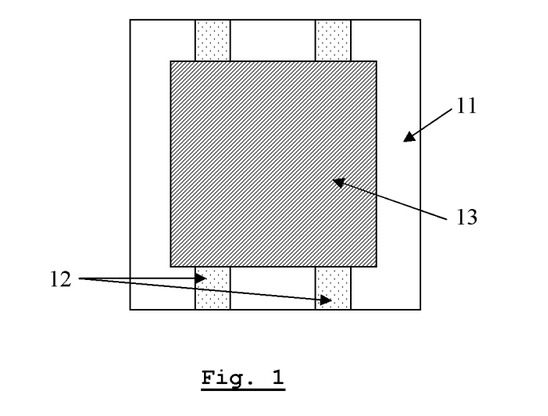
FIG. 1 schematically shows a top view of a structure used to measure the resistance of silver contacts versus time at different temperatures.

Samples as shown in FIG. 1 were fabricated. Glass substrates 11 were cleaned with acetone and isopropanol (about 10 minute each) in an ultrasonic bath. On the substrates 11 two ITO stripes 12 with a width of about 3 mm were formed, with a distance of about 1 mm between both ITO stripes, the ITO stripes extending from one side of the substrate to an opposite side of the substrate. These stripes 12 were formed by patterning an ITO layer of ITO coated glass (Merck Displays Technologies, sheet resistance<about 20 Ω/square). As further illustrated, the ITO stripes 12 are provided for forming contacts that allow measuring the electrical resistance of silver pads 13. On top of the substrate 11 with ITO stripes 12, a layer of an ink comprising Ag nanoparticles was sprayed with an airbrush (by hand). A silver nanoparticle (NP) ink comprising about 25 wt % Silver nanoparticles (about 5 nm diameter) in Cyclohexane was used.

For applying the silver nanoparticle ink a commercially available airbrush (Badger 200 NH) powered by $N_2$ gas was used. Standard settings included a gas pressure of 0.13 MPa and a distance between the airbrush and the substrate of about 5 cm. A 0.5 cm wide pattern of droplets was sprayed on the substrate, wherein the droplets had a volume in the order of femtoliters, as deduced from a statistical analysis performed on sparse depositions. By moving the airbrush across the substrate, thereby spraying 0.5 cm wide stripes adjacent to each other, a uniform coverage of a complete substrate (1.25 cm×1.25 cm) was obtained. Patterning of the nanoparticle ink layer was obtained by providing a shadow mask with an opening of 1 cm×0.8 cm, such that a silver pad 13 with dimensions of 1 cm×0.8 cm was formed.

The thickness of the Ag nanoparticle layer varied from sample to sample and was in the range between about 230 nm and about 450 nm. This large variation in thickness is related to the experimental conditions, more in particular the application of the nanoparticle layer by hand.

Figure 2:
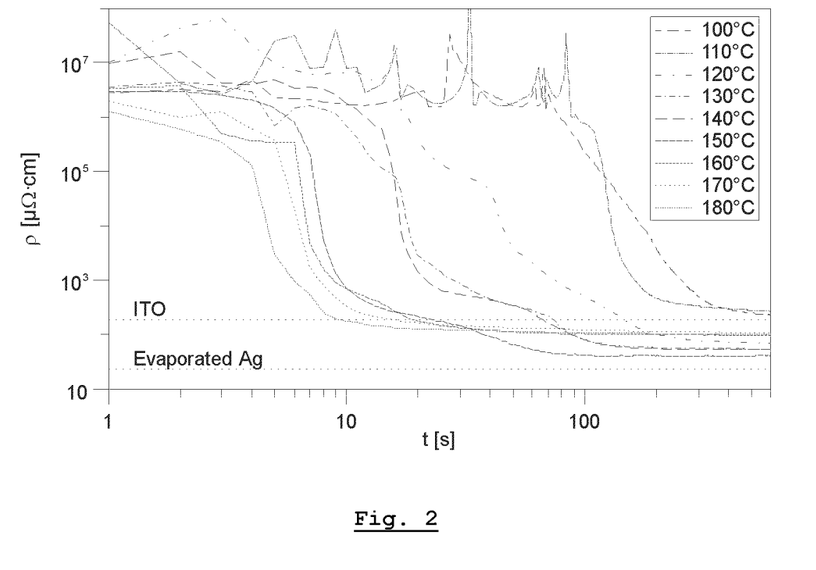
FIG. 2 shows the measured resistivity of Ag layers formed by sintering of an ink comprising Ag nanoparticles, as a function of annealing time for different annealing temperatures.

The samples (with the structure as shown in FIG. 1) were connected to a parameter analyzer (Agilent 4156C). Then the samples were brought into contact with a pre-heated hot plate at fixed temperature. Experiments were done in the temperature range from about 100° C. to about 180° C., with intervals of about 10° C. For each temperature the electrical resistance of the silver pads was measured versus time during 10 minutes. Because of the differences in thickness of the Ag nanoparticle layer on the different samples, the measured data were corrected: for each sample, the final electrical resistivity (i.e. the resistivity that was obtained after about 10 minutes of annealing on the hot plate) was calculated from $R_{sheet} \cdot d$, where $R_{sheet}$ is the sheet resistance, evaluated at 20° C. with a four probe station (FPP 5000 Veeco Instruments Inc.), and d is the average thickness of the deposition (as determined with a Dektak V 200-Si profilometer). Based on these resistivity values, the curves were corrected. This was done to eliminate the geometry and temperature dependence of the resistance measurements. The measurement results are depicted in FIG. 2, showing the resistivity as a function of sintering duration for a range of sintering temperatures between about 100° C. and about 180° C. As a reference, also the resistivity of a 100 nm ITO layer and the resistivity of a 100 nm thick evaporated silver layer are shown.

The sheet resistance of all the samples (after about 10 minutes of thermal treatment at a temperature T), together with the thickness of the films, is reported in Table 1. $R_{meas}$ is the value measured with the parameter analyzer as described above, $R_{sheet}$ is the sheet resistance as measured with the four point probe station, d is the average thickness and ρ is the calculated resistivity.

TABLE 1

| T [° C.] | $R_{meas}$ [Ohm] | $R_{sheet}$ [Ohm per square] | d [nm] | ρ [micro-Ohm cm] |
|---|---|---|---|---|
| 100 | 27.934 | 10.00 | 232 | 270.883 |
| 110 | 24.59 | 10.07 | 269 | 270.883 |
| 120 | 13.949 | 1.715 | 410 | 70.315 |
| 130 | 18.12 | 1.546 | 353 | 54.5738 |
| 140 | 17.019 | 1.172 | 454 | 53.2088 |
| 150 | 16.627 | 1.006 | 406 | 40.8436 |
| 160 | 13.127 | 2.29 | 415 | 95.035 |
| 170 | 11.839 | 2.57 | 417 | 107.169 |
| 180 | 12.9 | 2.98 | 334 | 99.532 |
| ITO | — | 19.4 | 100 | 194 |
| Ag | — | 2.36 | 100 | 23.6 |

From the results shown in FIG. 2 it can be concluded that the resistivity of the Ag films formed by spray coating of a Ag nanoparticle ink decreases rapidly by several orders of magnitude upon starting the sintering process, and then saturates to a resistivity in the range between about 40 and about 100 micro-Ohm cm (for sintering temperatures above about 110° C.). The time needed for obtaining this resistivity is inversely related to the sintering temperature. For example, for a sintering temperature of about 150° C. or more, a few seconds are sufficient to obtain saturation of the resistivity values. The resistivity values obtained for the Ag films are close to the one obtained for an evaporated Ag layer (24 micro-Ohm cm). The higher resistivity of some of the formed metal layers may be explained by incomplete sintering.

Figure 3:
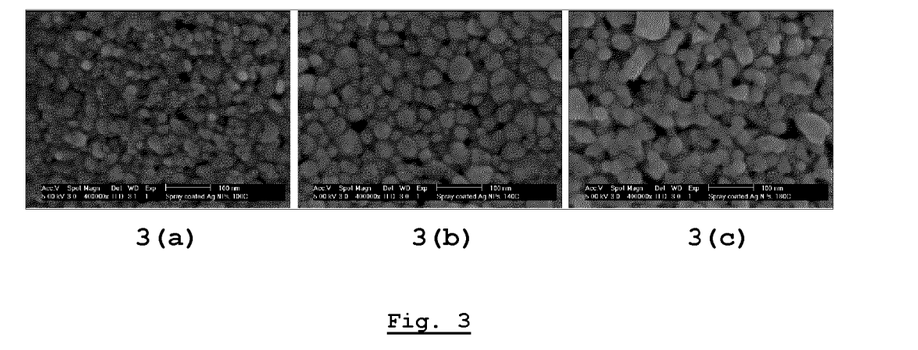
FIG. 3 shows SEM top scans of Ag films formed by sintering of an ink comprising Ag nanoparticles, for sintering at 100° C.

FIG. 3 shows SEM pictures of three samples after about 10 minutes sintering at different temperatures: FIG. 3(a) for sintering at about 100° C., FIG. 3(b) for sintering at about 140° C. and FIG. 3(c) for sintering at about 180° C. From these pictures, it is clear that the annealing process leads to merging of the nanoparticles, but the resulting layer does not have a good uniformity and is not smooth. With increasing temperature larger agglomerates of nanoparticles are formed. The calculation of resistivity as described above, however, was performed on the average thickness for these samples, while the minimum thickness greatly impacts the electrical performance of the layer.

The curves of FIG. 2 show a two step profile, revealing the two phase characteristic of the process. The Ag nanoparticle ink comprises nanoparticles that are capped by a functional group that prevents their coalescence and keeps them dispersed in the solvent. After the deposition, the solvent evaporates at ambient temperature, thereby leaving an agglomerate of nanoparticles that are still capped by the functional group. When the temperature is increased, in a first step this thin capping layer is removed by sublimation, leaving silver nanoparticles without a capping layer. The sudden change in resistivity that can be observed in the measurement results of FIG. 2 corresponds to a change in the visual appearance of the layers. The sudden change in resistivity corresponds to the layers becoming shiny. In this phase, the electrical resistivity is still relatively high because of the limited physical contact between the nanoparticles. The second step in the process is the actual sintering process, where the nanoparticles are slowly melted to form a continuous, highly conductive layer.

Certain characteristics of an ink that may be used for performing the method according to one embodiment are the presence of a functional group that sublimates or is decomposed at low temperatures (e.g., at a temperature below about 150° C. or lower) and the nanoparticles having an average size in the nanometer range (e.g., ≤10 nm). The metal nanoparticles for use in the method according to one embodiment have a size comprised in the range between about 2 nm and about 10 nm, particularly between about 2 nm and about 7 nm, more particularly between about 2 nm and about 5 nm.

The highest temperature that is allowed in a method according to one embodiment depends on the substrate used and any layers that are provided before forming the metal contact. More in particular, the processing temperature of the metal contact formed according to a method according to one embodiment can be raised to the maximum temperature for which none of the layers forming the underlying structure is negatively affected or damaged. The layers forming the underlying structure may for example include the substrate (e.g. glass, polymer material such as PET or PEN foil), an organic semiconductor layer, etc.

The preferred size of the nanoparticles is related to the annealing or sintering temperature. It is known that the temperature needed for annealing or sintering decreases with decreasing nanoparticle size, because of the larger surface-to-volume ratio of smaller nanoparticles. The preferred nanoparticle size also depends on the material used. For the ink used in the experiments described herein, temperatures just above about 120° C. are sufficient for the films to reach the maximum conductivity. At lower temperatures, e.g. as low as about 100° C., the films still reach a good electrical conductivity, but a much longer sintering time is needed to obtain the maximum conductivity.

Experiments were done wherein fully solution processed organic photovoltaic cells were fabricated with top metal contacts (i.e. metal contacts formed after providing an active organic semiconductor layer) formed by spray coating of a Ag nanoparticle ink as described above. It was found that spray coating of Ag contacts directly on an organic semiconductor layer results in damage to the organic semiconductor layer.

Figure 4:
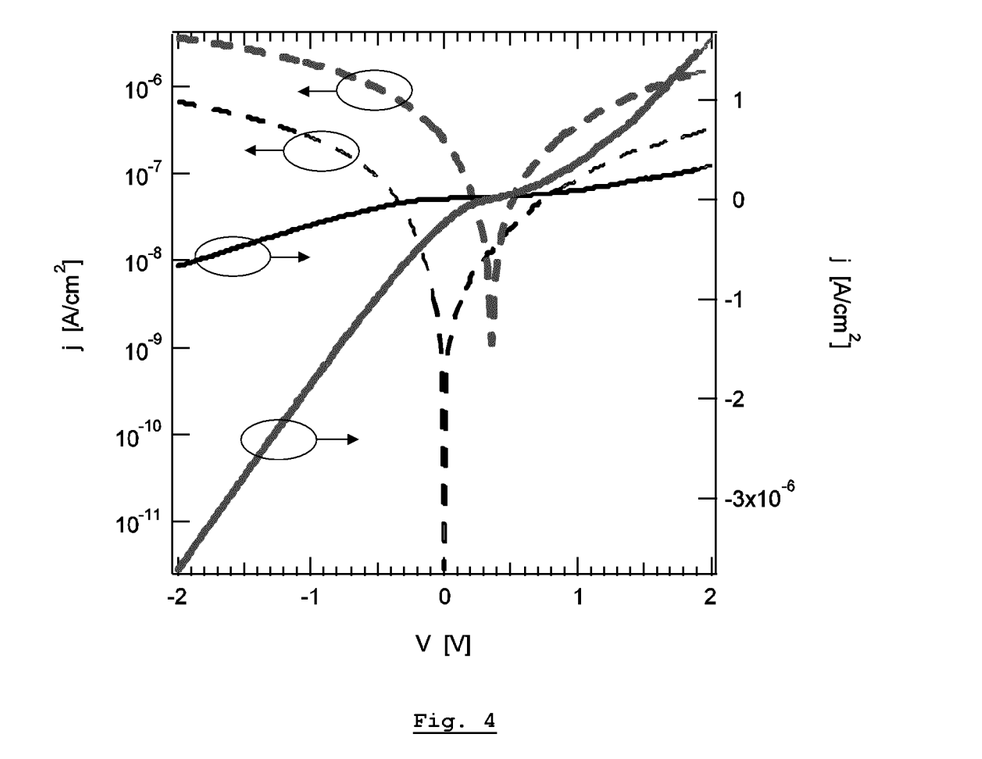
FIG. 4 shows the current-voltage characteristics in dark (thin lines) and under 100 mW/cm$^2$ AM1.5 illumination (thick lines) of organic photovoltaic cells produced with solution processed Ag contacts without the use of a PEDOT:PSS buffer layer. The characteristics are shown on a linear scale (full lines) and on a logarithmic scale (dashed lines).

FIG. 4 shows the current-voltage characteristics in dark and under 100 mW/cm$^2$ AM1.5 simulated solar illumination of organic photovoltaic cells produced with solution processed Ag contacts directly on the organic semiconductor layer. The devices show poor rectification, with curves characterized by a high series resistance. Without wishing to be bound by theory, it is believed that this high series resistance is caused by a high contact resistance between the organic semiconductor layer and the top metal contact. The current density is low (μA/cm$^2$ range), indicating a poor charge carrier extraction. The extraction of charges may be compromised by problems at the interface between the organic semiconductor layer and the metal contact. Without wishing to be bound by theory, it is believed that the low current density is due to the presence of nanoparticles (from the nanoparticle ink) in the organic semiconductor layer, creating recombination centers for the charges, and/or it may be due to a chemical interaction of the solvent and/or the capping agent of the nanoparticle ink with materials composing the active organic semiconductor layer. Under illumination, the devices generate an open-circuit voltage $V_{oc}$ around about 400 mV, which is substantially lower than typical values, and a Fill Factor limited by an S-shaped curve to less than about 25%. As will be apparent to those skilled in the art, the Fill Factor (FF) gives an indication on how much of the open circuit voltage and short circuit current is "utilized" at maximum power in the corresponding photovoltaic cells (the FF being the ratio of the maximum power to the product of the open-circuit voltage and the short-circuit current).

In order to avoid damage of the Ag nanoparticle ink or of the process for forming the metal contacts to the underlying organic semiconductor layer, a barrier layer, e.g. a charge collecting barrier layer may be provided on the organic semiconductor layer. For a standard organic photovoltaic solar cell structure, wherein a cathode or electron extracting contact is formed after providing the organic semiconductor layer, there is a need for a stable, and/or solution processable, electron collecting barrier layer. Such a electron collecting barrier layer can for example be formed by a layer comprising a conductive oxide such as ZnO, TiO, or other low work function, solution processable materials, such as metal oxide nanoparticles or precursor solutions that can be converted to low work function materials. However, as for example reported by S. H. Eom et al in "Preparation and characterization of nano-scale ZnO as a buffer layer for inkjet printing of silver cathode in polymer solar cells", Solar Energy Materials and Solar Cells 92 (2008), pp 564-570, which is incorporated herein by reference, solution processing of such a layer on top of a polymer layer may lead to a morphology that still allows penetration through the barrier layer of solvents (e.g. from the nanoparticle ink) or other components such as the nanoparticles themselves or the capping agent. This may lead to damage to the underlying organic semiconductor layer and thus result in low photovoltaic cell efficiencies.

In one embodiment, it is preferred to use an inverted organic photovoltaic cell structure, wherein a cathode or electron extracting contact is formed before providing the organic semiconductor layer, and wherein an anode or hole extracting contact is formed after providing the organic semiconductor layer.

When forming the top metal contact (i.e. anode) of such an inverted structure by spray coating of a nanoparticle ink, there is a need for a stable, preferably solution processable, hole collecting barrier layer between the organic semiconductor layer and the hole extracting metal contact (anode). Such a hole collecting barrier layer can for example comprise a conductive polymer such as PEDOT, polyaniline, polypyrroles, carbon black, or any combinations thereof.

The hole collecting barrier layer may comprise materials that provide a good hole extracting interface with the active layer and a good ohmic contact with the anode. In one embodiment, the hole collecting barrier layer for use in the method may comprise PEDOT:PSS. The thickness of this barrier layer may be sufficiently large to prevent possible damage to the underlying active organic semiconductor layer that may for example be caused by processing of the metal contact.

Typically, the thickness of the hole collecting barrier layer for use herein may be comprised between about 10 nm and about 100 nm, more particularly between about 10 nm and about 50 nm, even more particularly between about 10 nm and about 30 nm.

Suitable organic semiconductor layer for use herein comprises, but are not limited to, semiconducting polymers, semiconducting small-molecules, fullerene derivatives, or any combinations thereof. In one embodiment, the organic semiconductor layer for use in the method comprises P3HT:PCBM.

Figure 5:
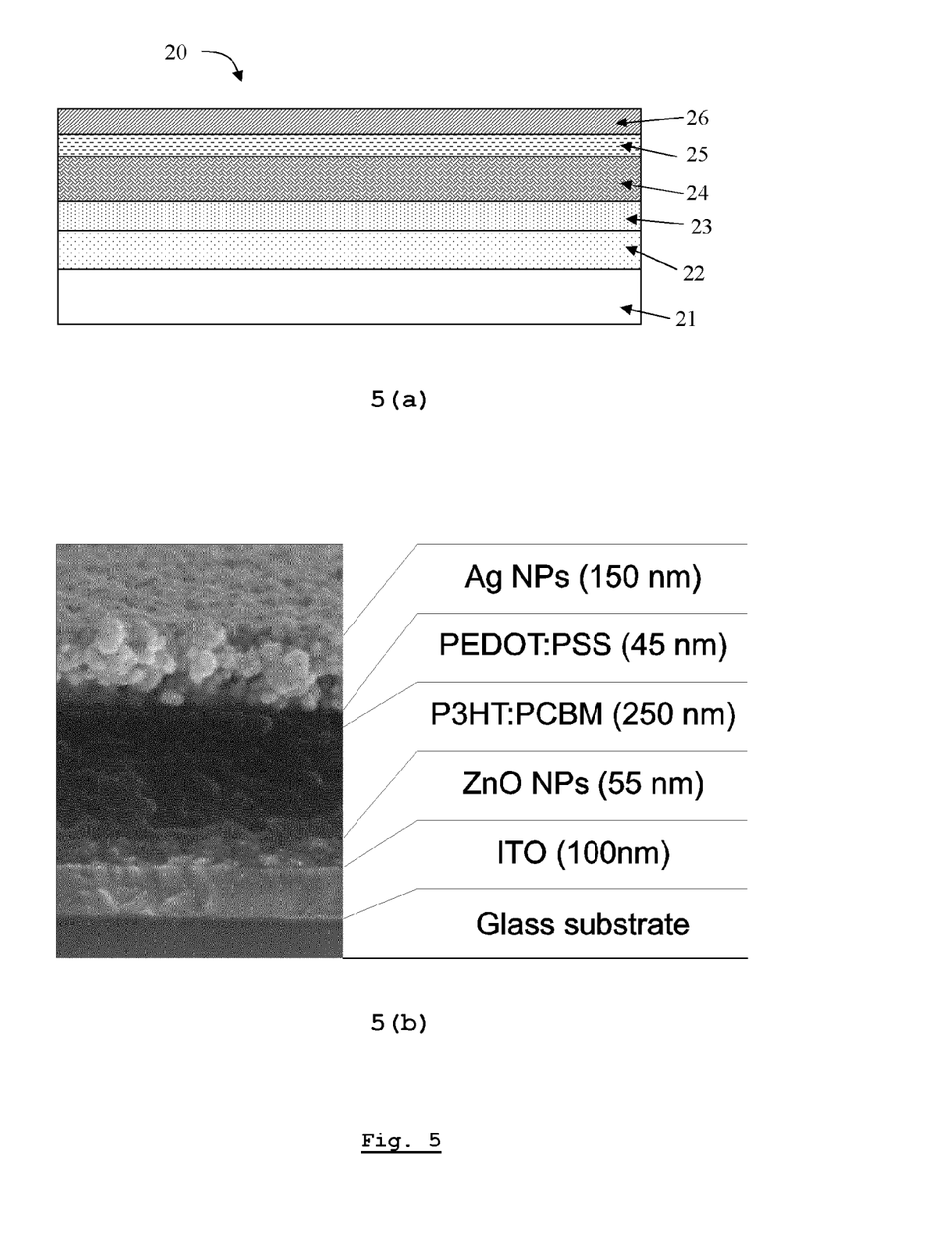
FIG. 5(a) illustrates the structure of a photovoltaic cell fabricated according to one aspect of a method according to one embodiment.
FIG. 5(b) shows a SEM cross section of the structure represented in FIG. 5(a).

The inverted organic photovoltaic cell structure 20 that was used in the experiments for fabricating fully solution processed organic photovoltaic cells is shown in FIG. 5(a). The structure is based on a glass substrate 21 with an ITO (IndiumTinOxide) electrode layer 22 and with a ZnO electron collecting layer 23 on top of it. However, other suitable transparent electron collecting layers known by a person skilled in the art could be used, such as for example TiO, $Cs_2CO_3$ or metal oxides. On the ZnO layer, an organic semiconductor layer 24 (active layer, e.g., comprising P3HT:PCBM or any other suitable material known by a person skilled in the art) is present, with a hole collecting barrier layer 25 (e.g., PEDOT:PSS) and finally an anode 26 (e.g., comprising Ag). FIG. 5(b) shows a SEM cross section of such a structure.

P3HT refers to poly(3-hexyl thiophene). PCBM refers to (6,6)-phenyl C61-butyric acid methylester. PEDOT refers to poly(3,4-ethylenedioxythiophene) and PSS refers to poly (styrene-sulfonate).

Organic photovoltaic cells have been produced on top of patterned ITO-glass substrates. The substrates were first cleaned with a detergent, de-ionized water, isopropyl alcohol and acetone in an ultrasonic bath. A dispersion of ZnO nanoparticles in acetone was spin coated in air on the substrates to produce a 55 nm thick layer. After an annealing process on a hot plate in dark at about 150° C., the samples were brought in a nitrogen glove box for the deposition of the active layer. A P3HT:PCBM solution in ortho-dichlorobenzene (oDCB) in a 1:1 ratio with a concentration of 30 mg/ml was prepared and stirred for about 24 hours at about 50° C. Spin coating of this solution was performed at about 1000 RPMs for about 60 and then the samples were dried under a petri-dish, according to the "slow drying" method. The hydrophobic surface of the P3HT:PCBM layer was rendered hydrophilic with a short oxygen-plasma treatment (6"). PEDOT:PSS was then applied in air by spin coating at about 3000 RPMs for about 60", to produce a 46 nm thick hole collecting barrier layer. The samples were then transferred again in a $N_2$ glove box, where a thermal treatment to remove the excess water was performed at about 120° C. for about 10'. Afterwards, the samples were fixed on a sample holder and covered with a shadow mask. A top contact (acting as an anode) was then formed according to the method, using a silver nanoparticle ink and performing a sintering process for about 5 minutes at about 150° C. This resulted in eight photovoltaic devices per sample with an active area of about 3 $mm^2$ each.

Figure 6:
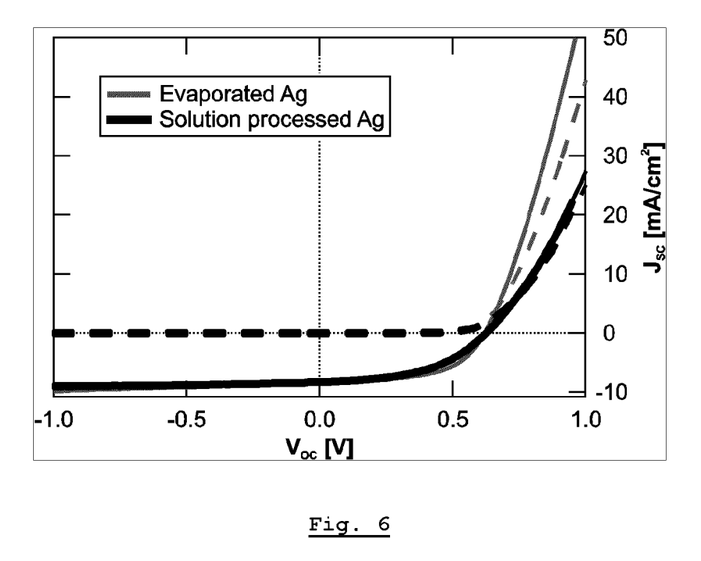
FIG. 6 shows the current-voltage characteristics in dark (dashed lines) and under 100 mW/cm$^2$ AM1.5 illumination (full lines) of organic photovoltaic cells with evaporated Ag contacts (thin lines) and with solution processed Ag contacts (thick lines) manufactured according to one aspect of a method according to one embodiment.

The resulting organic photovoltaic cells were measured in dark and under 1.5 AM simulated solar illumination (100 $mW/cm^2$). The current-voltage characteristics of such an organic photovoltaic cell (with a hole extracting contact fabricated according to a method and the current-voltage characteristics of a reference device with the same structure but with an evaporated Ag anode are shown in FIG. 6. The reference device shows performances in line with the values reported in literature. The organic photovoltaic cell with a solution processed anode shows a slightly higher series resistance, demonstrated by the slope of the current-voltage curve at forward bias, as well as a small leakage current at reverse bias. These two aspects affect the fill factor (FF), which is reduced approximately from 55% (for the reference device with evaporated anode) to 49% (for the cell with solution processed anode). However, the energy conversion efficiency of the device is not compromised, since a high short circuit current ($J_{SC}$) above 8 mA/cm$^2$ is extracted from the contacts, and the open circuit voltage ($V_{OC}$) reaches values as high as 625 mV. The power conversion efficiency exceeds about 3%. The experiments show that organic photovoltaic cells with good conversion efficiency can be manufactured by solution processing and at temperatures below about 150° C., making the process compatible with flexible substrates such as for example polyethylene naphthalate (PEN) foils. Advantageously, apart from ITO patterning there is no need for lithographic processing.

From the results shown in FIG. 2, it can be concluded that at an annealing temperature of about 150° C., the electrical resistance of the solution processed Ag film saturates after about 120 seconds, which is shorter than typical annealing conditions for P3HT:PCBM organic photovoltaic cells. When P3HT:PCBM is deposited from a fast drying solvent, typically an annealing or thermal treatment may be done to obtain a good performance. Such a thermal treatment results in a change in the morphology of this layer, thereby creating an optimal phase separation and a crystallization of both the PCBM and the P3HT, leading to an optimized absorption, charge generation and transport properties of the layer. Such annealing treatments are often performed at temperatures in the range between about 130° C. and 150° C. for time intervals in the range of about 5 to 10 minutes. For example, standard post-production annealing conditions for P3HT:PCBM organic solar cells may comprise about 5 minutes annealing at about 150° C. Such a process therefore satisfies the requirements for sintering of the solution processed contact, without the need to introduce further thermal treatments. Therefore, this thermal treatment can be done after the complete processing of the photovoltaic cell, i.e. after providing the metal nanoparticle layer. Both treatments (annealing of the P3HT:PCBM layer and sintering of the metal nanoparticle layer) can then be performed simultaneously.

Figure 7:
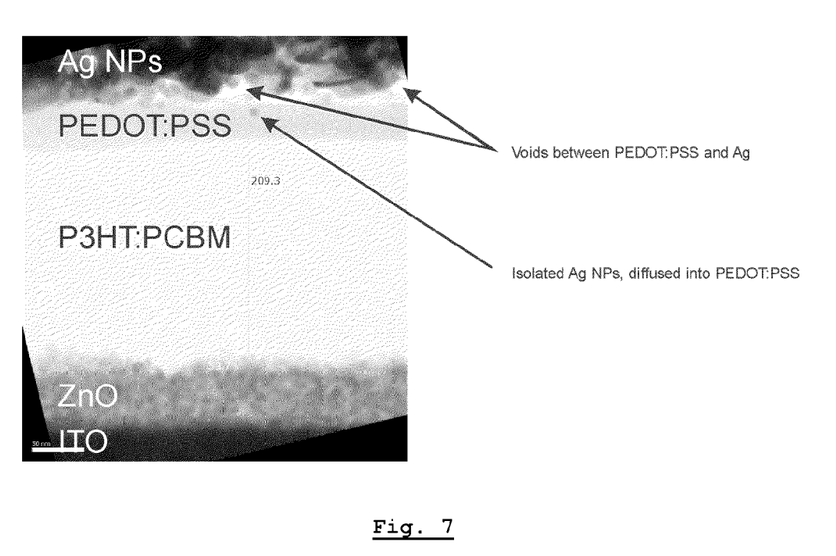
FIG. 7 shows a TEM cross section of the structure of an organic photovoltaic cell with a hole extracting contact fabricated according to one aspect of a method according to one embodiment.

FIG. 7 shows a TEM cross section of an organic photovoltaic cell with a hole extracting contact fabricated according to a method in one embodiment. The arrows highlight the presence of defects. It can be seen that isolated nanoparticles are present in the PEDOT:PSS layer and that this PEDOT:PSS layer acts as a barrier layer, preventing diffusion of nanoparticles (or other components of the nanoparticle ink) into the underlying organic semiconductor layer. In the absence of a suitable barrier layer, nanoparticles may diffuse into the organic semiconductor layer and cause defects, possibly leading to undesired charge recombination and thus poor carrier extraction from the organic photovoltaic cell and a reduced output current. This is in line with the results shown in FIG. 4. Furthermore, as illustrated in FIG. 7, voids are present underneath the Ag contact layer, i.e. at the interface between the PEDOT:PSS layer and the Ag contact layer. In the absence of a PEDOT:PSS layer in between the active organic semiconductor layer and the contact layer, i.e. in case the contact layer would be provided directly on the active layer, charges generated in the active layer in areas where voids are present would not be extracted by the contact. This would result in a high series resistance and a low output current (in line with the results shown in FIG. 4). This problem may be solved to a large extent by providing a suitable hole collecting (barrier) layer, e.g., PEDOT:PSS layer, in between the active organic semiconductor layer and the contact layer. The PEDOT:PSS layer creates a good interface with the active layer, thus collecting charges generated in the active layer even in areas where voids are present. As the PEDOT:PSS layer is electrically conductive these charges can be extracted at the nearest location where the PEDOT:PSS layer is in contact with the Ag contact layer, thus allowing a good current extraction from the organic photovoltaic cell.

According to another aspect, one embodiment relates to a method for manufacturing an organic device selected from the group consisting of organic photovoltaic cells, organic thin film transistors, organic light emitting devices, organic diodes and organic photodiodes, the method comprising forming an electrical contact of the organic device according to the method as described above. In this method for manufacturing an organic device, the organic device may be selected from organic photovoltaic cells.

In another inventive aspect, it is provided herein a method for manufacturing a fully solution processed organic photovoltaic cell (with an inverted cell structure), the method comprising forming a hole extracting contact of the photovoltaic cell according to the method as described above. In this method for manufacturing a fully solution processed organic photovoltaic cell, the organic photovoltaic cell may have an inverted cell structure, as described hereinabove.

In a method for manufacturing a fully solution processed organic photovoltaic cell (with an inverted cell structure), the photovoltaic cell (with an inverted cell structure) may provide a power conversion efficiency that exceeds about 3%, particularly about 4%, more particularly about 5%, even more particularly about 6%.

In still another aspect, there is a fully solution processed organic photovoltaic cell (with an inverted cell structure) comprising a hole extracting contact, wherein the hole extracting contact has been obtained according to the method as described above. The fully solution processed organic photovoltaic cell may have an inverted cell structure, as described hereinabove. In one embodiment, the fully solution processed organic photovoltaic cell (with an inverted cell structure) provides a power conversion efficiency that exceeds about 3%, particularly about 4%, more particularly about 5%, even more particularly about 6%.

The foregoing description details certain aspects of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various aspects, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of forming an electrical contact layer on an organic semiconductor layer, the electrical contact layer comprising a metal, the method comprising:
   providing a charge collecting barrier layer on the organic semiconductor layer;
   providing a liquid composition comprising a precursor for the metal on the charge collecting barrier layer; and performing a sintering process,
wherein the charge collecting barrier layer is interposed between the liquid composition and the organic semiconductor layer to form a substantially impermeable barrier against permeation of components of the liquid composition into the organic semiconductor layer,
wherein the electrical contact layer is a hole extracting contact layer.

2. A method of forming an electrical contact layer on an organic semiconductor layer, the electrical contact layer comprising a metal, the method comprising:
providing a charge collecting barrier layer on the organic semiconductor layer;
providing a liquid composition comprising a precursor for the metal on the charge collecting barrier layer; and
performing a sintering process,
wherein the charge collecting barrier layer is interposed between the liquid composition and the organic semiconductor layer to form a substantially impermeable barrier against permeation of components of the liquid composition into the organic semiconductor layer,
wherein the charge collecting barrier layer is a hole collecting layer.

3. The method according to claim 1, wherein the charge collecting barrier layer comprises an electrically conductive polymer.

4. The method according to claim 1, wherein the charge collecting barrier layer comprises PEDOT:PSS.

5. The method according to claim 1, wherein the process of providing a charge collecting barrier layer is performed by a solution processing method.

6. The method according to claim 1, wherein the liquid composition comprises an ink comprising metal nanoparticles.

7. The method according to claim 1, wherein the process of providing a liquid composition on the charge collecting barrier layer is performed by spray coating.

8. The method according to claim 1, wherein the method is performed at temperatures below 150° C.

9. The method according to claim 1, wherein the electrical contact layer has an electrical conductivity higher than $10^4$ S cm$^{-1}$.

10. The method according to claim 1, wherein the electrical contact layer has an electrical conductivity higher than $10^5$ S cm$^{-1}$.

11. The method according to claim 1, wherein the electrical contact layer has an electrical conductivity between $10^5$ S cm$^{-1}$ and $10^6$ S cm$^{-1}$.

12. A method of manufacturing a fully solution processed organic photovoltaic cell, comprising:
forming a hole extracting contact layer of the photovoltaic cell on an organic semiconductor layer, the hole extracting contact layer comprising a metal, forming the hole extracting contact layer comprising:
providing a charge collecting barrier layer on the organic semiconductor layer;
providing a liquid composition comprising a precursor for the metal on the charge collecting barrier layer; and
performing a sintering process,
wherein the charge collecting barrier layer is interposed between the liquid composition and the organic semiconductor layer to form a substantially impermeable barrier against permeation of components of the liquid composition into the organic semiconductor layer.

13. The method according to claim 12, wherein the photovoltaic cell provides power conversion efficiency that exceeds 3%.

14. The method according to claim 12, wherein the photovoltaic cell provides power conversion efficiency that exceeds 6%.

15. A method of manufacturing an organic device, the organic device being one of: organic photovoltaic cells, organic thin film transistors, organic light emitting devices, organic diodes and organic photodiodes, the method comprising forming an electrical contact of the organic device according to the method of claim 1.

16. The method according to claim 15, wherein the organic device is an organic photovoltaic cell.

* * * * *